United States Patent
Azuma et al.

[11] Patent Number: 6,025,619
[45] Date of Patent: Feb. 15, 2000

[54] THIN FILMS OF $ABO_3$ WITH EXCESS A-SITE AND B-SITE MODIFIERS AND METHOD OF FABRICATING INTEGRATED CIRCUITS WITH SAME

[76] Inventors: Masamichi Azuma, 4820 Nightingale Dr., Apt. D301, Colorado Springs, Colo. 80918; Carlos A. Paz De Araujo, 215 e. Sunbird cliffs La., Colorado Springs, Colo. 80919; Michael C. Scott, 4730 Nightingale Dr., Apt. K305, Colorado Springs, Colo. 80918

[21] Appl. No.: 08/982,816

[22] Filed: Dec. 2, 1997

Related U.S. Application Data

[62] Division of application No. 08/270,510, Jul. 5, 1994, Pat. No. 5,723,361, which is a continuation of application No. 08/165,082, Dec. 10, 1993, which is a continuation-in-part of application No. 08/132,744, Oct. 6, 1993, Pat. No. 5,514,822, which is a continuation-in-part of application No. 07/993,380, Dec. 18, 1992, Pat. No. 5,456,945, application No. 07/981,133, Nov. 24, 1992, Pat. No. 5,423,285, and application No. 07/965,190, Oct. 23, 1992, abandoned, which is a continuation-in-part of application No. 07/807,439, Dec. 13, 1992, abandoned, said application No. 07/981,133, is a continuation-in-part of application No. 07/807,439.

[51] Int. Cl.$^7$ .................................................. H01L 29/76
[52] U.S. Cl. ........................................... 257/295; 295/310
[58] Field of Search ..................................... 257/295, 310; 438/240

[56] References Cited

U.S. PATENT DOCUMENTS

| | | | |
|---|---|---|---|
| 5,423,285 | 6/1995 | Paz De Araujo et al. | 117/90 |
| 5,456,945 | 10/1995 | McMillan et al. | 427/252 |
| 5,514,822 | 5/1996 | Scott et al. | 556/28 |
| 5,624,707 | 4/1997 | Azuma et al. | 427/96 |
| 5,690,727 | 11/1997 | Azuma et al. | 106/287.18 |
| 5,723,361 | 3/1998 | Azuma et al. | 437/180 |

OTHER PUBLICATIONS

E. Fujii, et al,; ULSI DRAM Technology with $Ba_{0.7}Sr_{0.3}TiO_3$ Film of 1.3nm Equivalent $SiO_2$ Thickness and $10^{-9}$ A/cm$^2$ Leakage Current; IEDM Technical Digest, 1992; pp. 10.3.1–10.3.4.

Kuniaki Koyama, et al,; A Stacked Capacitor with $(Ba_xSr_{1-x})TiO_3$ For 256 DRAM; IEDM, Dec. 1991; pp. 32.1.1–32.1.4.

W.D. Kingery, et al,; Introduction to Ceramics, Second Edition; pp. 969–971.

G.M.Vest, et al,; Synthesis of Metallo–Organic Compounds For MOD Powders and Films; Materials Research Society Symp. Proc. vol. 60, 1986; pp. 35–42.

Robert W. Vest, et al.; $PbTiO_3$ Films From Metalloorganic Precursors; IEEE Transactions on Ultrasonics, Ferroelectrics, and Frequency Control, vol. 35, No. 6, No. 1988; pp. 711–717.

M. Azuma, et al.; Electrical Characteristics of High Dielectric Constant Materials For Integrated Ferroelectrics; ISIF, 1992; pp. 109–117.

J.V. Mantese, et al.; Metalorganic Deposition (MOD): A Nonvacuum, Spin–on, Liquid–Based, Thin Film Method: MRS Bulletin, Oct. 1989; pp. 48–53.

B.M. Melnick, et al,; Process Optimization and Characterization of Device Worthy Sol–Gel Based PZT For Ferroelectric Memories; Ferroelectrics, 1990, vol. 109, 1990; pp. 1–23.

*Primary Examiner*—Sara Crane

[57] ABSTRACT

A method for fabricating an integrated circuit capacitor having a dielectric layer comprising BST with excess A-site and B-site materials such as barium and titanium added. An organometallic or metallic soap precursor solution is prepared comprising a stock solution of BST of greater than 99.999% purity blended with excess A-site and B-site materials such as barium and titanium such that the barium is in the range of 0.01–100 mol %, and such that the titanium is in the range of 0.01–100 mol %. A xylene exchange is then performed to adjust the viscosity of the solution for spin-on application to a substrate. The precursor solution is spun on a first electrode, dried at 400° C. for 2 to 10 minutes, then annealed at 650° C. to 800° C. for about an hour to form a layer of BST with excess titanium. A second electrode is deposited, patterned, and annealed at between 650° C. to 800° C. for about 30 minutes. The resultant capacitor exhibits an enlarged dielectric constant with little change in leakage current.

4 Claims, 3 Drawing Sheets

6,025,619

THIN FILMS OF ABO₃ WITH EXCESS A-SITE AND B-SITE MODIFIERS AND METHOD OF FABRICATING INTEGRATED CIRCUITS WITH SAME

This application is a division of application Ser. No. 08/270,510, filed Jul. 5, 1994, U.S. Pat. No. 5,723,361, which is a continuation of U.S. patent application Ser. No. 08/165,082 filed Dec. 10, 1993, which is in turn a continuation-in-part of U.S. patent application Ser. No. 08/132,744 filed Oct. 6, 1993, U.S. Pat. No. 5,518,822, which is in turn a continuation-in-part of U.S. patent application Ser. No. 07/993,380 filed Dec. 18, 1992, U.S. Pat. No. 5,456,945 Ser. No. 07/981,133 filed Nov. 24, 1992, U.S. Pat. No. 5,423,285 and Ser. No. 07/965,190 filed Oct. 23, 1992; abandoned the latter two applications are in turn continuations-in-part of U.S. patent application Ser. No. 07/807,439 filed Dec. 13, 1991, abandoned.

BACKGROUND OF THE INVENTION

1. Field of the Invention

This invention relates to the fabrication of thin films used in integrated circuits, more specifically to fabrication of materials used in high dielectric constant capacitors for integrated circuits.

2. Statement of the Problem

Metal oxide materials, such as barium strontium titanate ("BST"), have become important for making integrated circuit thin film capacitors having high dielectric constants. Such capacitors are useful in fabricating integrated circuit memories such as DRAMs. See for example, Kuniaki Koyama et al., "A Stacked Capacitor with $(Ba_xSr_{1-x})TiO_3$ For 256M DRAM" in IDEM (International Electron Devices Meeting) *Technical Digest,* December 1991, pp. 32.1.1–32.1.4, and U.S. Pat. No. 5,122,923 issued to Shogo Matsubara et al. The capacitors used in a DRAM integrated circuit are the predominant element determining the size of each DRAM cell. To reduce the DRAM cell size, and thereby increase DRAM cell densities in an integrated circuit, requires reduction in the size of the capacitor. Reducing the capacitor size is achieved by increasing the dielectric constant of the material used in the dielectric layer of the capacitor so that a smaller surface area is required for a capacitor having desired dielectric properties. Prior methods for increasing the dielectric constant of material have also increased the leakage current of the material. Excessive leakage current renders the material unfit for capacitors in integrated circuits and in particular, unfit for capacitors in DRAM cells. It remains a problem in the field to increase the dielectric constant of materials, even for high dielectric constant material such as BST, without significantly increasing the leakage current.

3. Solution to the Problem

The present invention improves upon prior fabrication methods for BST to increase the dielectric constant of the dielectric material for use in integrated circuit memories, such as DRAMs, by blending excess A-site and B-site materials with the barium, strontium, and titanium liquid precursors used to produce the dielectric layer. The excess A-site and B-site materials increases the real part of the dielectric constant of the dielectric layer of the capacitor with little or no effect on leakage current.

The process of the present invention includes blending of excess A-site and B-site materials such as barium and titanium with liquid precursors comprising barium, strontium, and titanium to form a homogenous liquid suitable for spin-on deposition processes. Liquid precursors suitable for this process are preferably metal carboxylates or metal alkoxides. Co-pending U.S. patent application Ser. No. 08/132,744 filed Oct. 6, 1993, recites the use of an alkoxycarboxylate liquid precursor in the fabrication of BST. Co-pending U.S. patent application Ser. No. 08/165,082 filed Dec. 10, 1993, which is hereby incorporated by reference herein, recites the use of a spin-on process with liquid precursors to form a layer of BST. Applying similar "spin-on" methods for fabrication to the present invention permits more accurate control of the structure and distribution of the excess A-site and B-site materials within the BST dielectric layer of integrated circuit capacitors.

The quantity of excess A-site material preferably ranges from an amount greater than zero (i.e., about 0.01 mole percent) to 100 mole percent ("mol %") of the stoichiometric amount that is required to satisfy the general formula $ABO_3$, wherein a 1:1:3 molar ratio exists between A (an A-site material), B (a B-site material), and oxygen. Accordingly, the total amount of A-site material preferably ranges from about 100.01 to about 200% of the stoichiometric amount from the general formula. This excess A-site material more preferably ranges from about 0.1 to 20 mol %, and most preferably ranges from about 1 to 3 mol % of the stoichiometric amount. Similarly, the excess B-site material preferably ranges from 0.01 to 100 mol %, more preferably ranges from about 0.1 to 20 mol %, and most preferably ranges from about 1 to 3% of the stoichiometric amount.

The precursor solution including excess A or B material is preferably applied to a substrate by utilizing a spin-on process to form a thin film. The coated substrate is then heated, preferably within the range of 100° C. to 500° C., in order to remove the organic residue from the applied thin film. The thin film is preferably annealed at a temperature from about 600° C. to 850° C. in the presence of oxygen. These methods result in the fabrication of a high quality dielectric substance, such as BST, with excess A-site and B-site materials providing substantially improved dielectric properties for use in integrated circuit capacitors like DRAMs. Numerous other features, objects and advantages of the invention will become apparent from the following description when read in conjunction with the accompanying drawings.

DETAILED DESCRIPTION OF THE PREFERRED EMBODIMENT

Figure 1:
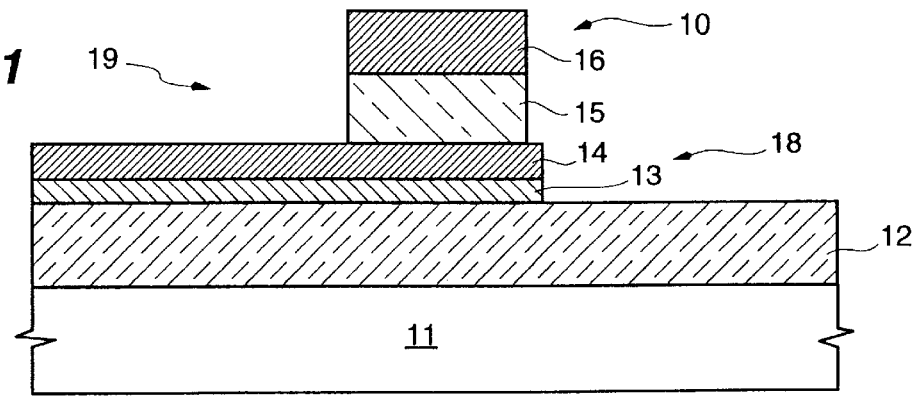
FIG. 1 is a cross-sectional view of an integrated circuit capacitor that was fabricated according to the present invention.

FIG. 1 depicts a thin film capacitor 10, which is fabricated according to the methods discussed below. As will be understood by those skilled in the art, the capacitor 10 is formed on a single crystal silicon wafer 11 having a thick layer 12 of silicon dioxide formed thereon. An adhesion layer 13 of titanium having a thickness of about 200 Å is then formed followed by a first electrode layer 14 of platinum having a thickness of about 2000 Å. Both layers 13 and 14 are preferably formed through the use of conventional sputtering protocols. A dielectric layer 15, which is preferably a metal oxide such as BST, is formed adjacent first electrode layer 14. BST dielectric layer 15 preferably includes excess A-site and B-site materials as described in detail below. A second platinum electrode 16 (also preferably about 2000 Å thick) is sputtered atop dielectric layer 15.

In the integrated circuit art, the silicon crystal 11 is often referred to as a "substrate." Herein, "substrate" may be used to refer to the silicon layer 11, but more generally will refer to any support for another layer. By way of example, the substrate 18 for the dielectric layer 15 is most immediately platinum first electrode 14, but also broadly includes layers 11, 12, and 13.

The term "metal oxide" herein means a material of the general form $ABO_3$ where A and B are cations and O is the anion oxygen. The term is intended to include materials where A and B represent multiple elements; for example, it includes materials of the form $A'A''BO_3$, $AB'B''O_3$, and $A'A''B'B''O_3$, where A', A'', B' and B'' are different metal elements. Preferably, A, A', A'', are metals selected from the group of metals consisting of Ba, Bi, Sr, Pb, Ca, and La, and B, B', and B'' are metals selected from the group consisting of Ti, Zr, Ta, Mo, W, and Nb. A, A', and A'' are collectively referred to herein as A-site materials. B, B', and B'' are collectively referred to herein as B-site materials.

The crystalline metal oxide of layer 15 preferably has a perovskite type structure as will be understood by those skilled in the art. Many of these metal oxides are classified as ferroelectrics though some may not exhibit ferroelectricity at room temperature. Nevertheless, ferroelectrics of the invention typically have high dielectric constants, and are useful in high dielectric constant capacitors, whether or not they exhibit ferroelectric properties at normal operating temperatures.

In the present invention, excess A-site and B-site materials are blended with the metal oxide material. The "stoichiometric amount" of an A or B material hereof is hereby defined to be the amount required by the chemical formula for the stable compound. By way of example, a "stoichiometric" metal oxide precursor solution is a precursor solution including a plurality of metals, and in which the relative amounts of each metal in the solution has the same proportion as the proportion of the metal in the chemical formula for the desired metal oxide to be fabricated from the solution. In metal oxides having the formula $ABO_3$, there is one A-site atom and one B-site atom combined with three oxygen atoms (1:1:3); however the A-site and B-site material may be freely substituted for several equivalent materials as described above.

In a material having the form $AA'BO_3$, the ratio of A to A' A-site material is variable but the total number of A-site atoms is fixed as above with respect to B-site atoms and oxygen atoms. This ratio may be expressed as a formula template $A_xA'_{1-x}BO_3$ indicating that the total of A-site atoms equals one (X+1−X=1) combined with one B-site atom and three oxygen atoms. Therefore, though the total of A-site and B-site atoms is fixed by the stoichiometric formula, the ratio of A to A' A-site atoms is expressed as the ratio X/(1-X).

Figure 5:
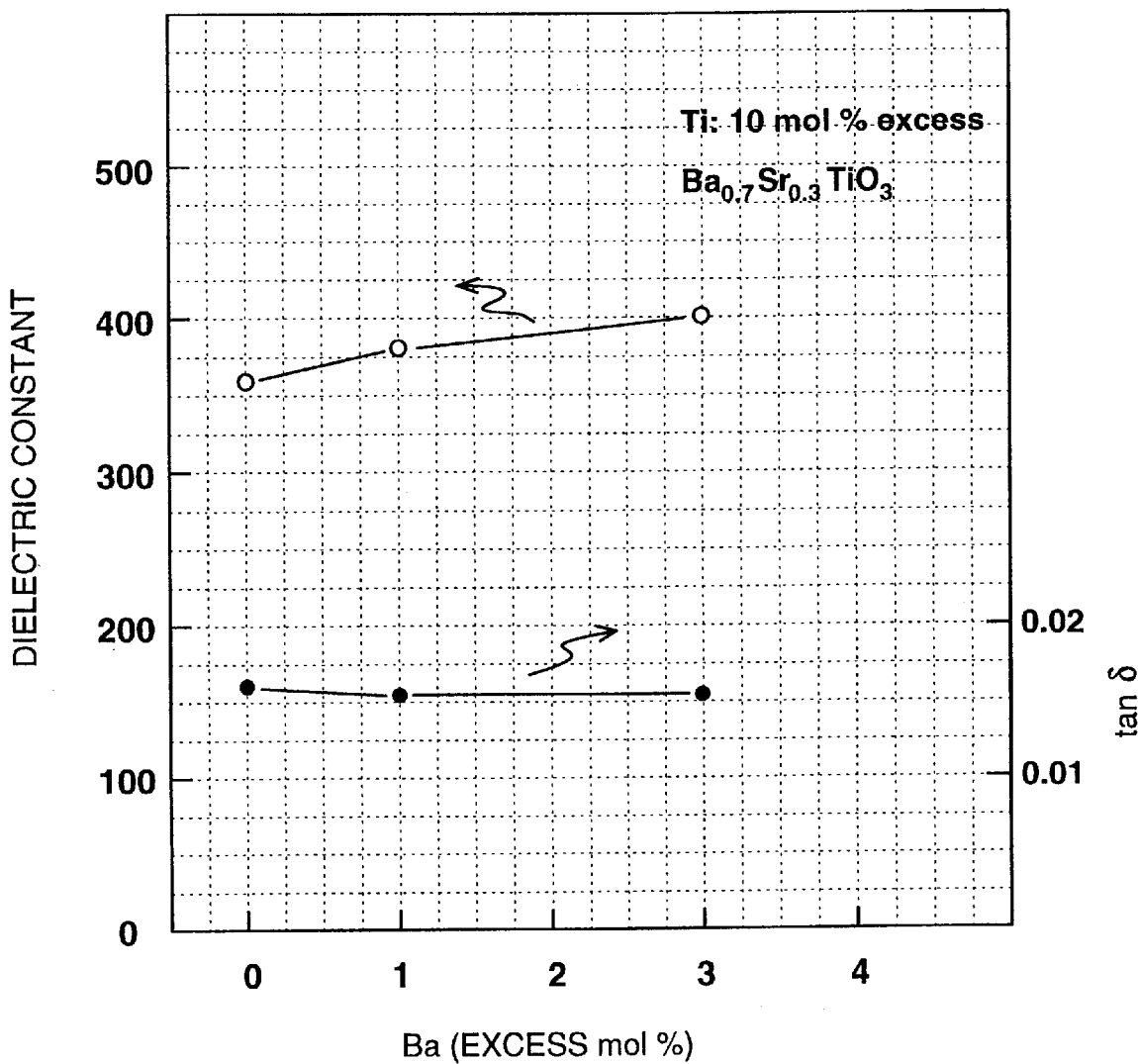
FIG. 5 is a graph of the dielectric constant, $\epsilon$, and dissipation factor, tan $\delta$, versus excess titanium content for excess A-site and B-site materials, BST capacitors made according to the process of the invention.

In the discussions herein, and particularly with respect to the abscissa of FIG. 5, the amount of excess A-site material is expressed in terms of mole % units (denoted mol %). This unit is a measure of the number of atoms of the excess A-site material as a percentage of the stoichiometric amount of A-site atoms in the underlying metal oxide material. For example, if the material is $Ba_{0.7}Sr_{0.3}TiO_3$, and the excess A-site material concentration is 10 mol %, then there are 10% more barium and 10% more strontium than would be present in a stoichiometric precursor solution. Similarly, if the excess B-site material concentration is 10 mol %, then there is 10% more titanium than is present in the stoichiometric precursor solution.

Figure 2:
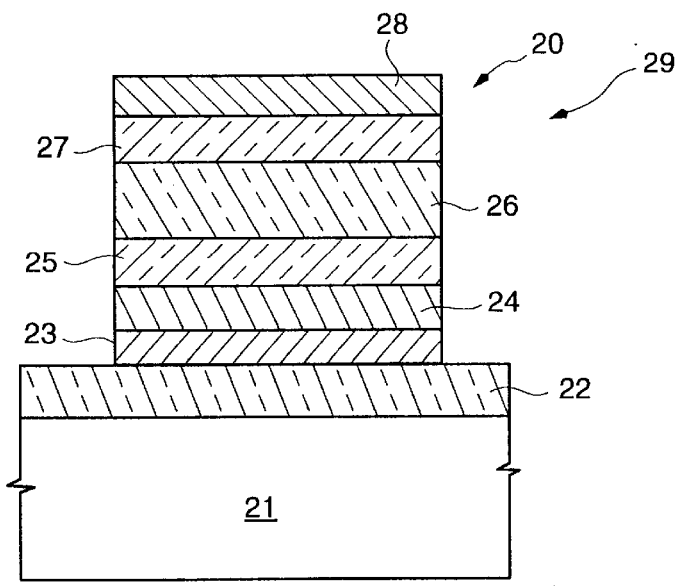
FIG. 2 is a cross-sectional view of another embodiment of an integrated circuit capacitor that was fabricated according to the present invention and which includes low leakage dielectric buffer layers.

FIG. 2 depicts a second embodiment of a capacitor according to the invention, i.e., capacitor 20 including substrate 21, insulating layer 22, adhesion layer 23, first electrode 24, second electrode 28, buffer layers 25 and 27, and dielectric layer 26. Layer 26 is preferably a ferroelectric material or other metal oxide. Buffer layers 25 and 27 are preferably made of a low-leakage dielectric material such as BST, which is fabricated as described below, e.g., $Ba_{0.3}Sr_{0.7}TiO_3$ or $Ba_{0.3}Sr_{0.7}TiO_3$. Other materials that are useful as the buffer layers 25 and 27 are $SiO_2$, $Si_3N_4$, $Ta_2O_5$, and $SrTiO_3$. Low-leakage buffer layers 25 and 27 are used when the principal dielectric 26 has more electrical leakage than is desirable. By way of example, non-volatile memories having ferroelectric materials of high polarizability may have an excessively high leakage current, and low-leakage buffer layers 25, 27 can serve to decrease the overall leakage of the capacitor 20.

Figure 3:
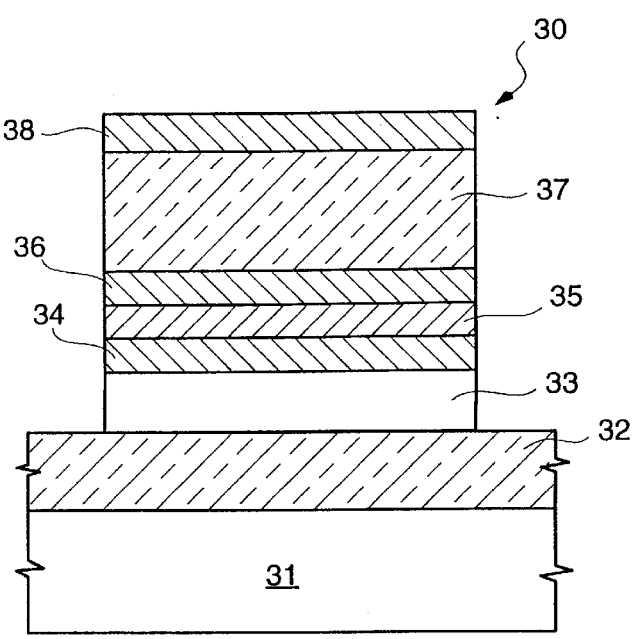
FIG. 3 is a cross-sectional view of a further exemplary embodiment of the present invention including an integrated circuit capacitor having adhesion and barrier layers.

FIG. 3 depicts a third embodiment of the present invention, i.e., capacitor 30 including substrate 31, insulating layer 32, adhesion layer 34, first electrode 36, second electrode 38, and a dielectric material 37 made by the process described below. It also includes a polysilicon layer 33 and a barrier layer 35 that is preferably made of titanium nitride. Co-pending U.S. patent application Ser. No. 08/165,133 filed Dec. 10, 1993, which is hereby incorporated by reference herein, describes these layers and methods of their fabrication. Note also that the application Ser. No. 08/165,133 describes adhesion layer 23 and its fabrication.

Other materials may be used the layers discussed above, such as silicon nitride for insulating layers 12, 22, and 32, gallium arsenide, indium antimonide, magnesium oxide, strontium titanate, sapphire or quartz for substrate 11, 21, or 31, and many other adhesion layer, barrier layer, and electrode materials. Furthermore, it should be understood that FIGS. 1 through 3 are not meant to be actual cross-sectional views of any particular portion of an actual electronic device, but are merely idealized representations which are employed to more clearly and fully depict the structure and process of the invention than would otherwise be possible. Accordingly, the relative thicknesses of the individual layers are not depicted proportionately; otherwise, some layers, such as the substrate 21 and insulator 22, would be so thick as to make the drawing unwieldy. Additionally, the respective capacitors 10, 20 and 30 preferably form a portion of an integrated circuit 19, 29, and 39, which also includes other electronic devices, such as transistors or other capacitors. These other devices are not depicted, for purposes of clarity. In addition, dielectric layers 15, 26, and 37 may be incorporated into other devices, such as ferroelectric FETS, as well as capacitors.

Figure 4:
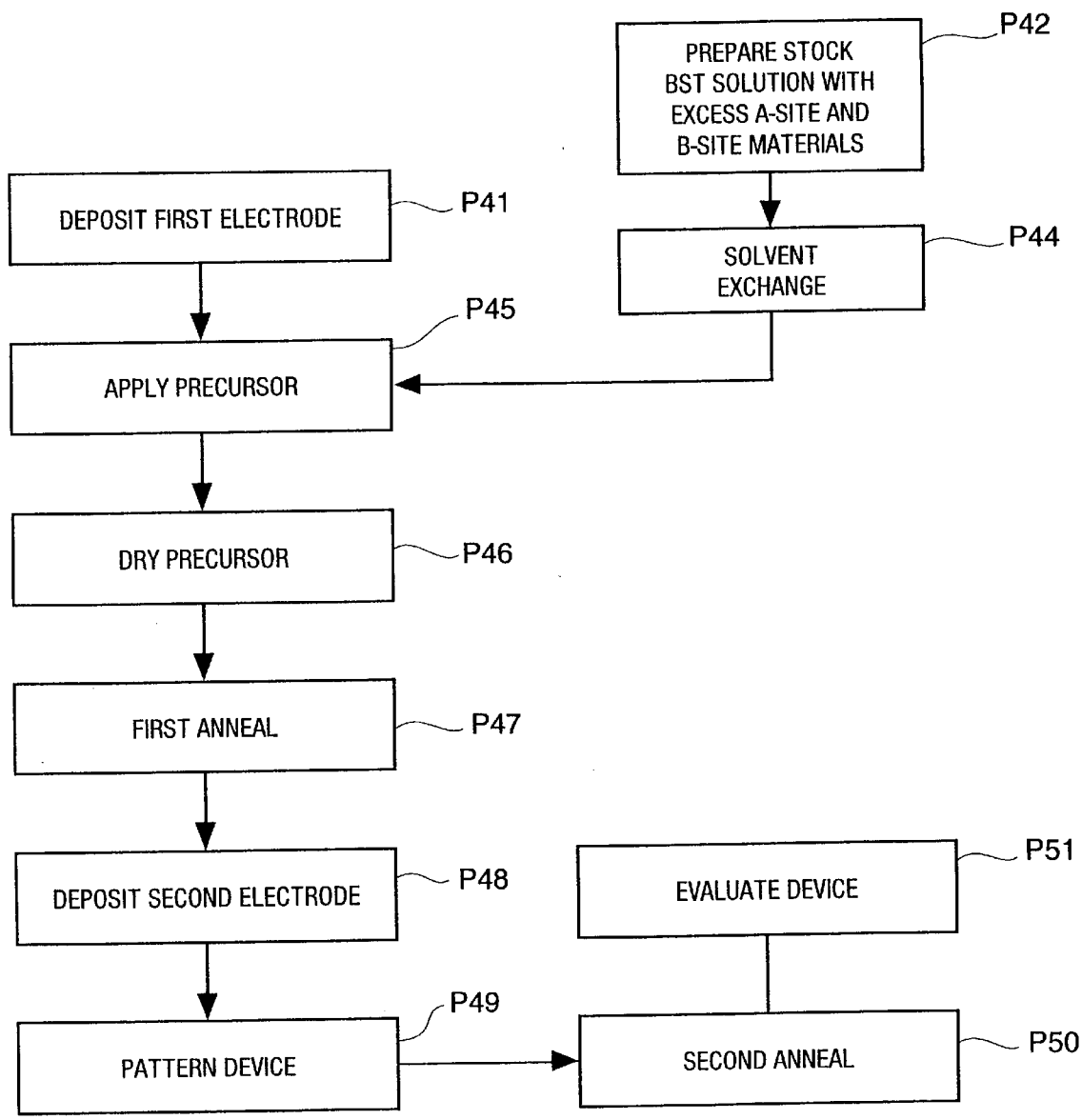
FIG. 4 is a flow chart of a process according to the present invention for fabricating a BST capacitor having respective excesses of A-site and B-site materials.

FIG. 4 depicts a flow chart of a process for fabricating capacitors 10, 20 and 30 of the present invention. The process shall be discussed in terms of the embodiment of FIG. 1, but be discussed equally well in terms of the other embodiments. In step P41 a first electrode 14 is deposited onto substrate 13, preferably by sputtering platinum as is known in the art.

In step P42, a BST solution is prepared with excess stoichiometric amounts of A-site and B-site materials, for subsequent use in step P45 and the eventual formation of dielectric layer 15. Step P42 may be completed at a time just prior to deposition of dielectric layer 15, but is generally done well in advance. The solution preparation steps P42 and P44 are preferably done under an inert atmosphere, such as an argon atmosphere.

An important feature of the invention is the ease with which specific excess A-site and B-site material concentrations can be added. In the prior art, which utilized methods such as doping, the precise dopant level achieved would be significantly less predictable and uniform when compared to that achieved using the methods of the present invention, due to inherent randomness in prior processes such as sputtering. Rather, in the prior art, one would fabricate a device, then test it to see what concentration was obtained. In contrast, the present method permits component fabrication that utilizes precise, uniform, and repeatable excess A-site and B-site material concentrations, and these concentrations are easily obtained. It should be apparent that the present invention lends itself to manufacturing much more readily than the prior art.

The BST stock solution is a precursor as generally described in co-pending U.S. patent application Ser. No. 08/132,744 filed Oct. 6, 1993 and hereby incorporated by reference herein; however, as will be described below in more detail, some differences exist between the Ser. No. 08/132,744 solution and that of the present invention. These BST solutions are typically prepared by reacting barium with 2-methoxyethanol and 2-ethylhexanoic acid, adding strontium, allowing the mixture to cool, and adding titanium isopropoxide and 2-methoxyethanol.

The precursor of the present invention differs from that of the patent application Ser. No. 08/132,744 in that excess quantities of A-site and B-site materials are added. Specifically, excess barium is added to the 2-methoxyethanol, and 2-ethylhexanoic acid and excess titanium isopropoxide are added to the 2-methoxyethanol to form a non-stoichiometric blend having excess A-site and B-site materials. The excess barium is blended to achieve an excess A-site material concentration ranging from about 0.01 to 100 mol %, as is the respective titanium, to achieve an excess B-site material concentration ranging from about 0.01 to 100 mol %. The blended solution is heated to obtain a final BST concentration of about 0.33 moles. Other organic complexes may be used in forming the precursor solution including: barium alkoxides, strontium alkoxides, and titanium alkoxides; barium carboxylates, strontium carboxylates, and titanium carboxylates. Particularly preferred alkoxides and carboxylates include barium 2-ethylhexanoate, strontium 2-ethylhexanoate, and titanium isopropoxide; barium 2-ethylhexanoate, strontium 2-ethylhexanoate, and titanium 2-ethylhexanoate; barium neodecanoate, strontium neodecanoate, and titanium isopropoxide; barium neodecanoate, strontium neodecanoate, and titanium neodecanoate; barium octanoates, strontium octanoates, and titanium octanoates.

After step 42, a solvent exchange step P44 is performed; however, this step, while very useful, is not absolutely necessary. This solvent exchange primarily substitutes a solvent that has a viscosity appropriate for the application process, e.g., the preferred "spin-on" process, for an initial solvent that is convenient for manufacturing the stock solution and/or which makes a precursor that stores well. An appropriate viscosity herein preferably means a lower viscosity than the stock solution. In this solvent exchange, xylene is most preferably exchanged for the 2-methoxyethanol solvent of the BST stock solution. Accordingly, xylene may be added to the stock solution, which is then heated to about 130° C. while stirring to boil away the other stock solvents like 2-methoxyethanol. This solvent exchange step, while very useful, is not necessary. N-butyl acetate also works well as a solvent, and may be substituted for xylene in the solvent exchange.

This method of forming the liquid precursor permits extremely accurate amounts of the excess A-site and B-site materials to be added to the BST, and the thorough stirring in the solvent exchange step, or other mixing step, ensures uniform dispersion of the excess A-site and B-site materials throughout the BST.

The use of carboxylates in this process significantly enhances the results, because gels are not formed, otherwise, gel formation could tend to impede the mixing and the uniform dispersion of the excess A-site and B-site materials into the BST. All of the liquid chemicals that are used in making the precursors, such as xylene, n-butyl acetate, and 2-methoxyethanol are preferably semiconductor grade chemicals, which is a well-known term in the semiconductor art.

In step P45, the precursor solution from step P44 is applied to the substrate 18. This treating step is preferably conducted by applying the precursor solution to substrate 18 and spinning substrate 18 at from about 1000 RPM to 2000 RPM for a time ranging from about 20 seconds to 60 seconds; however, other application methods may be used. By way of example, it is possible to use an alternative misted deposition process as is described in co-pending U.S. patent application Ser. No. 07/993,380 filed Dec. 18, 1992.

In steps P46 and P47, the precursor is treated to form a metal oxide dielectric material 15 on substrate 18. This treating step is preferably completed by drying and annealing the result of step P45. In step P46, the precursor is dried, preferably in dry air or nitrogen, and preferably at a relatively high temperature as compared to the prior art, i.e., at from about 100° C. to 500° C. for a time ranging between about one minute to about thirty minutes. Most preferably, drying is performed in air at about 400° C. for a time ranging from about 2 to 10 minutes. This high temperature drying step is essential in obtaining predictable properties in BST with excess A-site and B-site materials added.

In step P47, the dried precursor is annealed to form dielectric layer 15. This annealing step is referred to as the first annealing to distinguish it from a later annealing step. The first anneal is preferably performed in oxygen at a temperature of from about 600° C. to 850° C. This step is most preferably conducted at a temperature of about 800° C. for about 60 minutes in $O_2$ in a push/pull process including 10 minutes for the "push" into the furnace and 10 minutes for the "pull" out of the furnace. Careful control of the annealing temperature and time is also essential for predicable dielectric layer results.

In step P48 a second electrode 16 is deposited as discussed above. The device is then patterned, which may comprise only the patterning of the second electrode if any patterning was done after deposition of the first electrode. It is important that the device be patterned before the second anneal step P50 so that patterning stresses are removed by the annealing step, and any oxide defects created by the patterning are corrected.

The second annealing step, at step P50, is preferably performed at the same temperature as the first anneal in step P47, though variance within a small temperature range of from about 50° C. to 100° C. with respect to the first annealing temperature is possible depending on the excess A-site and B-site materials that may be selected as set forth above. The time for the second anneal is preferably less than for the first anneal, and is generally about 30 minutes in duration, though a range of time from about 20 minutes to 90 minutes is possible depending on the sample. Again, careful control of the annealing parameters is important to obtain predictable results. Finally, in step P51 the device is completed and evaluated.

Another factor that is important in obtaining good, predictable results in the dielectric materials is the use of high purity barium, strontium and titanium in making the precursors. Usually, what is called "high purity" barium, strontium, and titanium in the trade has impurity levels of between 1 in $10^4$ and 1 in $10^5$ atoms of impurities for the more abundant elements. Impurity levels this high will be referred to herein as "R&D grade" materials. Precursor solutions made with such R&D grade materials do not provide sufficiently predictable results for materials used in the present invention. The methods of the present invention require the use of material with higher purity, i.e. with impurities of less than 1 in $10^5$ atoms of impurities for any one element, or less than 10 parts per million.

Accordingly, a further feature of the invention is that the metal oxide precursors preferably contain impurities of less than 10 parts per million per impurity element. Relatively small amounts of impurities appear to give the best results in many cases. The normal level of impurity content in R&D grade BST may interfere with the desired dielectric properties. Moreover, since small amounts of impurities can make a significant difference in the electrical properties, for the results to be predictable, the material preferably should have impurities of 10 parts per million or less for each impurity element.

EXAMPLES

The following non-limiting examples set forth preferred methods and materials that may be utilized to practice the present invention.

Example 1

Reagent Purity Determination

Table 1 contains the measured impurity levels in parts per million for the higher purity precursor solutions and the R&D grade precursor solutions. Where an entry is left blank the impurity was not specified.

TABLE 1

| IMPURITY | HIGH PURITY SOLUTION Impurity Level in PPM | R & D SOLUTION Impurity Level in PPM |
|---|---|---|
| Na | 4.3 | 65 |
| K | 2.4 | 52 |
| Mn | 0.6 | 31 |
| Fe | <0.3 | 8 |
| Ni | 0.2 | |
| Mg | <0.1 | |
| Ca | 1.9 | |
| Zn | 0.1 | |
| Al | 0.3 | |
| Ag | <0.1 | |

TABLE 1-continued

| IMPURITY | HIGH PURITY SOLUTION Impurity Level in PPM | R & D SOLUTION Impurity Level in PPM |
|---|---|---|
| Cd | <0.1 | |
| Cu | 0.6 | |
| Li | <0.1 | |
| Mo | <2 | |
| Co | <0.1 | |
| Cr | <0.05 | |
| U | <0.002 | <5 |
| Th | <0.002 | <5 |

As indicated in Table 1, the "high purity" solution included no impurity element in a concentration greater than 4.3 parts per million, and the total of all impurities was only about 13 parts per million. The R&D grade solutions had impurity levels of 10 to 100 times higher. Preferably, for use in the present invention, the impurity level for most impurities will be 1 part per million or less.

Example 2

Production of BST Films on an Electrode by Using Excess A and B Site Materials

Various samples were produced with excess A-site and B-site materials added in accord with the methods of the present invention.

A standard stock solution containing 0.33 M BST ($Ba_{0.7}Sr_{0.3}TiO_3$) in 2-methoxyethanol was supplemented with 10 mol % titanium added as the excess B-site material, and 0 mol % barium as the excess A-site material.

After the A and B-site material supplementation, a xylene exchange was performed on the mixture. Xylene was introduced into the mixture in an amount sufficient to replace the 2-methoxyethanol, and the solution was heated to about 130° C. to distill off the non-xylene solvent fraction. Ignoring the excess A and B-site materials, the final precursor solution had a BST concentration of 0.32 M in xylene.

The precursor was applied to the substrate 14 under an inert atmosphere, spun at 1500 RPM for about 30 seconds, dried at 400° C. for 2 minutes on a hot plate in air, and annealed at 750° C. in oxygen for 70 minutes including a 10 minute push in and 10 minutes pull out. The final thickness of the BST layer 15 was 1600 Å.

Platinum top electrode 16 was deposited by sputtering and patterned. Capacitor 10 was then annealed again at 750° C. for 30 minutes in oxygen, including a 10 minute push in and pull out.

These method steps were repeated for two other samples by substituting different amounts for the 0% A-site material that was utilized above. Barium was added as the excess A-site material in amounts equating to 1% and 3% of the stoichiometric amount.

The electrical properties of the ten samples were measured according to standard techniques. FIG. 5 depicts a comparison of the electrical properties of the ten samples were thus evaluated. The FIG. 5 results include the real part of the dielectric constant, $\epsilon$ (indicated with open circles), the scale for which is on the left, and the dissipation factor, tan $\delta$ (indicated with filled circles), the scale for which is on the right. The abscissa for both ordinates is the excess A-site barium content in mol %. The dielectric constant steadily rises with increased excess A-site barium, while the dissipation factor falls slightly or remains about the same.

There have been described novel structures and processes for fabricating integrated circuit capacitors using metal oxides such as BST with excess A-site and B-site materials added. It should be understood that the particular embodiments shown in the drawings and described within this specification are exemplary in nature, and should not be construed to limit the invention. For example, the materials and methods described with respect to the capacitor 10 of FIG. 1 may be used with other capacitor structures, such as that of FIG. 3 or many other variations of capacitors; or the buffer layers 25 and 27 of FIG. 2 may be used in combination with the capacitors of FIGS. 1 and 3 as well as other capacitor structures. The structures and processes may be combined with a wide variety of other structures and processes. Equivalent materials, different material thicknesses, and other methods of depositing the substrate and electrode layers may be used. It is also evident that the process steps recited may in some instances be performed in a different order, or equivalent structures and processes may be substituted for the various structures and processes described.

Those skilled in the art will understand that the preferred embodiments, as hereinabove described, may be subjected to numerous modifications without departing from the true scope and spirit of the invention. Accordingly, the inventors hereby state their intention to rely upon the Doctrine of Equivalents, in order to protect their full rights in the invention.

We claim:

1. An integrated circuit containing a thin film barium strontium titanate layer having an $ABO_3$ perovskite formula with a plurality of A-site metals and a plurality of B-site metals produced by a method comprising the steps of:

providing a liquid precursor comprising barium, strontium, and titanium in proportions defined by a formula $$ABO_3,$$

wherein A includes a mixture of barium and strontium, B is titanium, and O is oxygen, and said liquid precursor additionally includes an A' material selected from the group consisting of bismuth, strontium, lead, calcium, lanthanum, and mixtures thereof, and a B' material selected from the group consisting of zirconium, tantalum, molybdenum, tungsten, niobium, and mixtures thereof, applying said liquid precursor to a substrate;

treating said liquid precursor on said substrate to form a thin film barium strontium titanate layer including said A' material and said B' material; and forming an integrated circuit including said thin film barium strontium titanate layer on said substrate.

2. In an integrated circuit containing a thin film barium strontium titanate layer having an $ABO_3$ perovskite formula with a plurality of A-site metals and a plurality of B-site metals, the improvement comprising:

a thin film containing oxides of barium, strontium, and titanium in proportions defined by a formula $$ABO_3,$$

wherein A includes a mixture of barium and strontium, B is titanium, and O is oxygen, said thin film including an A' material selected from the group consisting of bismuth, strontium, lead, calcium, lanthanum, and mixtures thereof, and said thin film including a B' material selected from the group consisting of zirconium, tantalum, molybdenum, tungsten, niobium, and mixtures thereof.

3. The integrated circuit of claim 2 wherein said A' material is present in an amount greater than 0 mol % and less than 100 mol % of A material in said thin film.

4. The integrated circuit of claim 2 wherein said B' material is present in an amount greater than 0 mol % and less than 100 mol % of B material in said thin film.

* * * * *